United States Patent
Kato

(10) Patent No.: US 6,608,744 B1
(45) Date of Patent: Aug. 19, 2003

(54) SOI CMOS INPUT PROTECTION CIRCUIT WITH OPEN-DRAIN CONFIGURATION

(75) Inventor: Katsuhiro Kato, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/432,102

(22) Filed: Nov. 2, 1999

(51) Int. Cl.[7] .................................................. H02H 3/22
(52) U.S. Cl. ......................................... 361/111; 361/56
(58) Field of Search ...................... 361/56, 111, 91.1, 361/91.5; 257/355, 356

(56) References Cited

U.S. PATENT DOCUMENTS

| | | | | |
|---|---|---|---|---|
| 4,989,057 A | * | 1/1991 | Lu ............................... | 357/23.7 |
| 5,237,395 A | * | 8/1993 | Lee .............................. | 257/358 |
| 5,521,415 A | * | 5/1996 | Kondo ......................... | 257/357 |
| 5,610,790 A | * | 3/1997 | Staab ........................... | 361/56 |
| 5,646,434 A | * | 7/1997 | Crysotomides et al. ...... | 257/355 |
| 5,811,857 A | * | 9/1998 | Assaderaghi et al. ........ | 257/355 |
| 5,991,135 A | * | 11/1999 | Saleh ........................... | 361/56 |
| 6,034,397 A | * | 3/2000 | Voldman ...................... | 257/335 |
| 6,130,811 A | * | 10/2000 | Gans et al. ................... | 361/18 |
| 6,266,222 B1 | * | 7/2001 | Colombo et al. ........... | 361/111 |

OTHER PUBLICATIONS

S. Voldman et al., "Dynamic Threshold Body– and Gate–Coupled SOI ESD Protection Networks," EOS/ESD Symposium 97, pp. 97–210–97–211.

* cited by examiner

Primary Examiner—Brian Sircus
Assistant Examiner—Z Kitov
(74) Attorney, Agent, or Firm—Voldentine Francos, PLLC

(57) ABSTRACT

An integrated circuit fabricated by silicon-on-insulator technology has an input terminal coupled to the gate electrodes of a CMOS inverter. Within the integrated circuit, the input terminal is coupled through a first protective element either to the power supply or to ground, but not to both. A second protective element is coupled in parallel with the inverter between the power supply and ground. This configuration protects both transistors in the inverter from input surges, without restricting the normal input voltage to the range between the power-supply voltage and ground.

3 Claims, 7 Drawing Sheets

SOI CMOS INPUT PROTECTION CIRCUIT WITH OPEN-DRAIN CONFIGURATION

BACKGROUND OF THE INVENTION

The present invention relates to the protection of a complementary metal-oxide-semiconductor (CMOS) integrated circuit (IC) fabricated by silicon-on-insulator (SOI) technology.

For protection from electrostatic discharge (ESD), the signal input terminals of CMOS ICs are often connected to internal power-supply lines through internal protective circuit elements that conduct when the input voltage goes above the power-supply voltage, and to internal ground lines through protective elements that conduct when the input voltage goes below the ground level. Electrostatic discharges and other abnormal input surges are thereby shunted to the power-supply or ground before they can damage internal logic circuits.

Some CMOS ICs, however, must be designed to accept input voltages higher than their native power-supply voltage without shunting input current to the power supply. Examples include ICs operating in mixed-voltage systems, and ICs with input specifications that set limits on input current at an input voltage exceeding the specified power-supply voltage. The internal protective elements connecting the signal input terminals to the power-supply lines must be omitted in these ICs, which are therefore at increased risk of gate-oxide damage to transistors on the power-supply side of their CMOS input circuits.

Similarly, there are CMOS ICs that must tolerate input signal voltages below the ground level without shunting input current to ground. In these ICs, the protective elements linking the signal input terminals to the internal ground lines must be omitted. These devices are at increased risk of gate-oxide damage to transistors on the ground side.

In bulk CMOS devices, these increased risks are moderated because the semiconductor substrate, which is of one conductive type, includes numerous wells of the opposite conductive type. The junctions between the substrate and its wells constitute parasitic diodes through which the ground lines are linked to the power-supply lines. If an input surge is conducted by a protective element to the ground lines, for example, the parasitic diodes then conduct the surge to the power-supply lines, so that all electrodes of the CMOS input circuits are at approximately the surge potential, and damage can be avoided.

This safeguard is not present in CMOS ICs fabricated by SOI technology, in which the circuit elements are formed on a layer of insulating material, without wells and their associated parasitic diodes. In an SOI CMOS device, if the input circuits have protective elements only on the ground side, or only on the power-supply side, then gate-oxide damage is liable to occur on the unprotected side.

SOI has significant advantages over bulk CMOS technology, however. One advantage is reduced power consumption, because current leakage into the substrate is substantially eliminated. Another advantage is higher switching speed, because the capacitance of source and drain areas is reduced. For these and other reasons, SOI. CMOS ICs are expected to come into increasing use, and adequate ESD protection must be provided.

SUMMARY OF THE INVENTION

An object of the invention is to provide ESD protection for an SOI CMOS IC having an input terminal that is not limited to the voltage range between the native power-supply and ground.

Another object is to provide such protection within the constraints of conventional logic-circuit design.

The invented input protection circuit is disposed in an SOI CMOS IC having an input terminal electrically coupled through an internal input signal line and resistor to the gate electrodes of a CMOS inverter. The CMOS inverter receives a first power-supply potential from a first internal power-supply line, and a second power-supply potential from a second internal power-supply line. The input protection circuit comprises:

a third internal power-supply line electrically coupled to the first internal power-supply line;

a first protective element coupled between the input signal line and the third internal power-supply line; and a second protective element coupled between the first and second internal power-supply lines.

The input protection circuit may also have a fourth internal power-supply line, electrically coupled to the second internal power-supply line, and a third protective element, coupled between the third and fourth internal power-supply lines.

The voltage at the input terminal is not restricted to the range between the first and second power-supply potentials, because the input signal line is coupled through a protective element to only one internal power-supply line.

Both sides of the CMOS inverter are protected from input surges, however, because the second protective element conducts surge current from one side to the other.

When the third protective element is provided, the second protective element need not be large, and can be laid out within the constraints of conventional logic design.

DETAILED DESCRIPTION OF THE INVENTION

Figure 1:
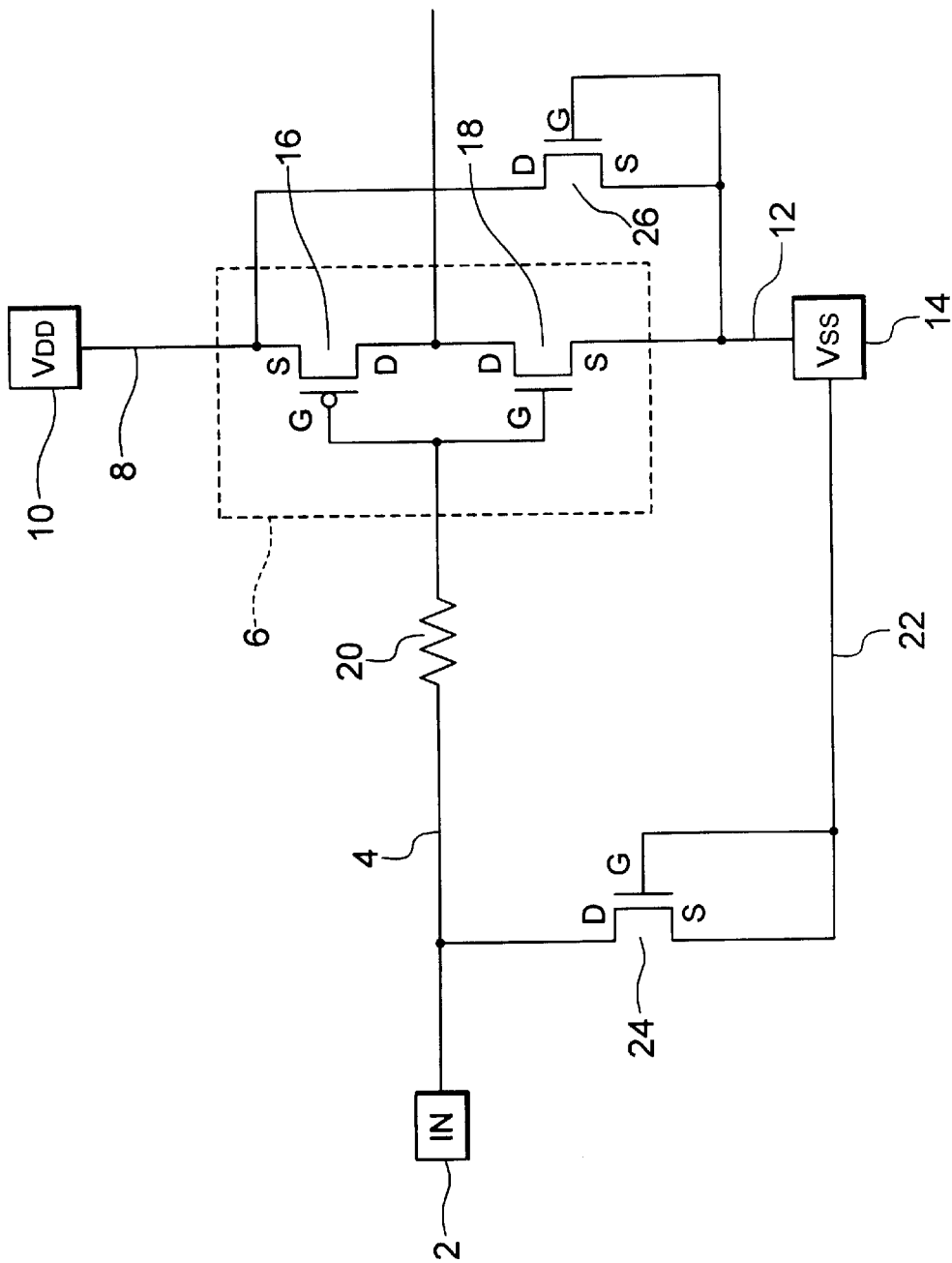
FIG. 1 is a circuit diagram illustrating a first embodiment of the invention.

Embodiments of the invention will be described with reference to the attached drawings, in which like parts are indicated by like reference characters. All transistors shown in the drawings are field-effect transistors, with source, gate, and drain electrodes identified by the letters S, G, and D. All of the embodiments are SOI CMOS input protection circuits.

In the embodiments, the first power-supply potential is the ground potential, and the first and third internal power-supply lines are referred to as ground lines.

Referring to FIG. 1, the embodiments pertain to an input circuit in which an input terminal 2 is coupled by an internal input signal line 4 to a CMOS inverter 6, which functions as the first input-circuit stage. The CMOS inverter 6 is supplied with power from an internal power-supply line 8, which is coupled to a power-supply terminal 10, and an internal ground line 12, which is coupled to a ground terminal 14. The input terminal 2, power-supply terminal 10, and ground terminal 14 are metal pads that are coupled to external circuits (not visible).

The CMOS inverter 6 comprises a p-channel metal-oxide-semiconductor (PMOS) transistor 16 with a source electrode coupled to power-supply line 8, and an n-channel metal-oxide-semiconductor (NMOS) transistor 18 with a source electrode coupled to ground line 12. The gate electrodes of both the PMOS transistor 16 and NMOS transistor 18 are coupled to the input signal line 4. The drain electrodes of PMOS transistor 16 and NMOS transistor 18 are interconnected, and are coupled to a next-stage logic circuit (not visible).

In the first embodiment, the input protection circuit comprises a resistor 20 inserted in series on the input signal line 4, limiting current flow into the gate electrodes of the CMOS inverter 6; another internal ground line 22 coupled to the ground terminal 14; a first NMOS protection transistor 24 having a drain electrode coupled to input signal line 4 and source and gate electrodes coupled to ground line 22; and a novel second NMOS protection transistor 26 having source and gate electrodes coupled to ground line 12. Preferably, the drain electrode of NMOS protection transistor 26 is coupled directly to the source electrode of PMOS transistor 16, as shown. Alternatively, the drain electrode of NMOS protection transistor 26 can be coupled to power-supply line 8 at a point near the source electrode of PMOS transistor 16. In either case, NMOS protection transistor 26 is coupled in parallel with CMOS inverter 6 between power-supply line 8 and ground line 12.

NMOS protection transistors 24, 26 are referred to as grounded-gate NMOS transistors. Under normal input conditions, both have zero gate-source voltages and are switched off.

By analogy with an open-drain output circuit, an input circuit of the general type in FIG. 1, in which there is a transistor coupled between the input signal line 4 and ground but no transistor coupled between the input signal line and the power supply, or in which there is a transistor coupled between the input signal line and the power supply but no transistor coupled between the input signal line and ground, is sometimes referred to as an open-drain input circuit.

Next, the operation of the first embodiment will be described.

Under normal conditions, the power-supply terminal 10 receives an external power-supply potential $V_{DD}$ and the ground terminal 14 receives an external ground potential $V_{SS}$. The input terminal 2 varies between a low logic level, which is not lower than $V_{SS}$, and a high logic level, which may be moderately higher than $V_{DD}$. As one example, $V_{DD}$ is three volts, $V_{SS}$ is zero volts, and the input terminal 2 receives a signal that varies between zero and five volts, from an IC (not visible) operating with a five-volt power supply. Under these conditions, the NMOS protection transistors 24, 26 do not conduct, the impedance of the input terminal 2 is high, and there is substantially no flow of input current, except for brief transient currents that charge or discharge the gate capacitance of the CMOS inverter 6 when the input logic level changes.

If a sufficiently strong positive voltage surge is applied to the input terminal 2, however, the first NMOS protection transistor 24 undergoes source-drain breakdown, similar to junction breakdown in a pn junction diode. This protection transistor 24 then conducts surge current onto internal ground line 22, raising the potential of ground terminal 14 and internal ground line 12 to a level relatively near the surge level, and considerably higher than $V_{DD}$. As a result, the roles of source and drain in the second NMOS protection transistor 26 are reversed, and this transistor 26 switches on, conducting channel current from internal ground line 12 to the source electrode of PMOS transistor 16. This NMOS protection transistor 26 also undergoes source-drain breakdown, so that the channel current is augmented by breakdown current. The source electrode of PMOS transistor 16 is thereby raised to a potential level relatively close to the surge level.

The surge is also conducted through the input signal line 4 and resistor 20 to the gate electrodes of PMOS transistor 16 and NMOS transistor 18. During the surge, the source and gate electrodes of PMOS transistor 16 are both at similar potential levels, relatively near the surge level. The potential across the gate oxide (illustrated later) of PMOS transistor 16 is therefore comparatively small, and PMOS transistor 16 is protected from electrostatic damage.

Similarly, NMOS transistor 18 is protected from electrostatic damage, because its gate potential and source potential are both comparatively close to the surge level.

If a sufficiently strong negative voltage surge is applied to the input terminal 2, the roles of source and drain in the first NMOS protection transistor 24 are reversed, and this protection transistor 24 switches on, as well as undergoing source-drain breakdown, thereby conducting the surge onto the internal ground lines 22, 12. The large potential difference between $V_{DD}$ and the negative surge voltage on internal ground line 12 causes the second NMOS protection transistor 26 to undergo source-drain breakdown, conducting the surge to the source electrode of PMOS transistor 16. Once again, the source and gate electrodes of PMOS transistor 16 are both brought to potentials comparatively near the negative surge level, protecting this transistor 16 from electrostatic damage. NMOS transistor 18 is likewise protected.

As explained above, the first embodiment protects both transistors in the CMOS inverter 6 against electrostatic discharges and other input surges, even though the input signal line 4 is coupled to a protection transistor only on the ground side. Furthermore, since the input signal line 4 is not coupled to a protection transistor on the power-supply side, an input signal at a level moderately exceeding $V_{DD}$ can be received at the input terminal 2 without causing a flow of input current. The allowable input voltage range is thus not limited to the range from $V_{SS}$ to $V_{DD}$ but extends above $V_{DD}$.

If the second NMOS protection transistor 26 were not present and the source electrode of PMOS transistor 16 were coupled only to the $V_{DD}$ power-supply line 8, then during an input surge, PMOS transistor 16 would be subjected to a gate-source voltage equal to the difference between the surge level and $V_{DD}$, and gate-oxide damage might occur.

Next, a second embodiment will be described.

Figure 2:
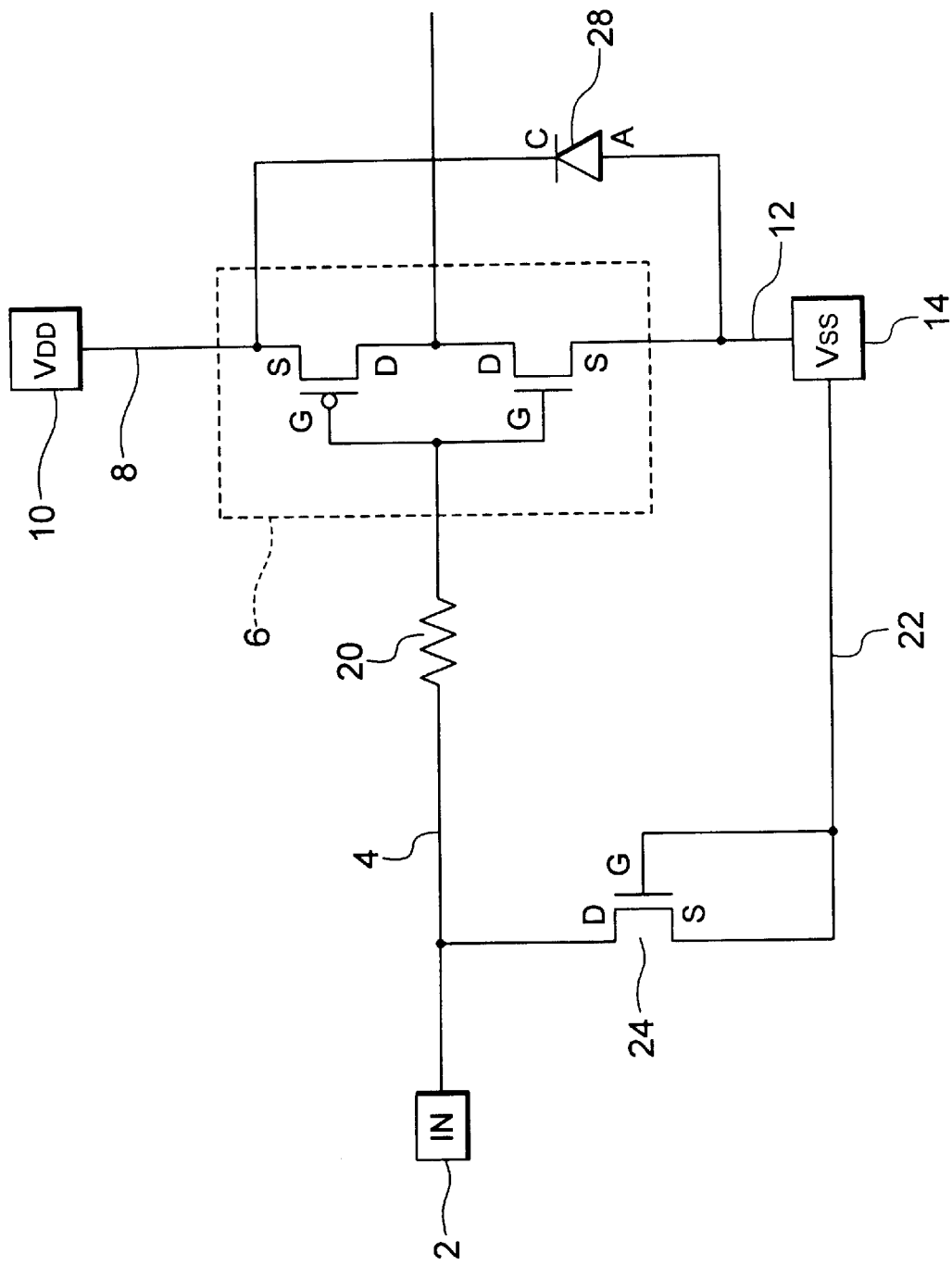
FIG. 2 is a circuit diagram illustrating a second embodiment.

Referring to FIG. 2, the second embodiment replaces the second NMOS protection transistor of the first embodiment with a pn junction diode 28. The anode (A) of the pn junction diode 28 is coupled to internal ground line 12, and the cathode (C) to the source electrode of PMOS transistor 16. The diode 28 is normally reverse-biased and does not conduct.

The second embodiment operates in substantially the same way as the first embodiment. If a large voltage surge is applied to the input terminal 2, it is conducted by NMOS protection transistor 24 onto the internal ground lines 22, 12. If the surge is positive, the pn junction diode 28 becomes forward-biased, switches on, and conducts the surge to the source electrode of PMOS transistor 16. If the surge is negative, the pn junction diode 28 undergoes junction breakdown, again conducting the surge to the source electrode of PMOS transistor 16. In either case, the source electrode of PMOS transistor 16 is brought to a potential sufficiently near the surge level to protect the gate oxide of PMOS transistor 16 from electrostatic damage.

An advantage of the pn junction diode 28 in the second embodiment is that it takes up less space than the NMOS protection transistor 26 employed in the first embodiment.

In a variation of the second embodiment, the first NMOS protection transistor 24 is also replaced by a pn junction diode.

To protect PMOS transistor 16, the NMOS protection transistor 26 in the first embodiment and pn junction diode 28 in the second embodiments must be disposed near the CMOS inverter 6. Since the CMOS inverter 6 is normally disposed near further logic circuits (not visible), design constraints may require that the NMOS protection transistor 26 or pn junction diode 28 not be too large. Since the NMOS protection transistor 26 or pn junction diode 28 only has to conduct enough surge current to alter the source potential of PMOS transistor 16, this requirement can easily be met.

There is a further consideration, however. If, for example, a positive voltage surge strong enough to cause pn junction breakdown is applied to the power-supply terminal 10, the NMOS protection transistor 26 or pn junction diode 28 becomes the most direct path for surge current to take from the power-supply terminal 10 to the ground terminal 14. The NMOS protection transistor 26 or pn junction diode 28 needs to be large enough to carry the resulting current surge. If design constraints on the size of the NMOS protection transistor 26 or pn junction diode 28 preclude this, an alternate current path is needed.

The third and fourth embodiments, described below, provide such an alternate current path.

Figure 3:
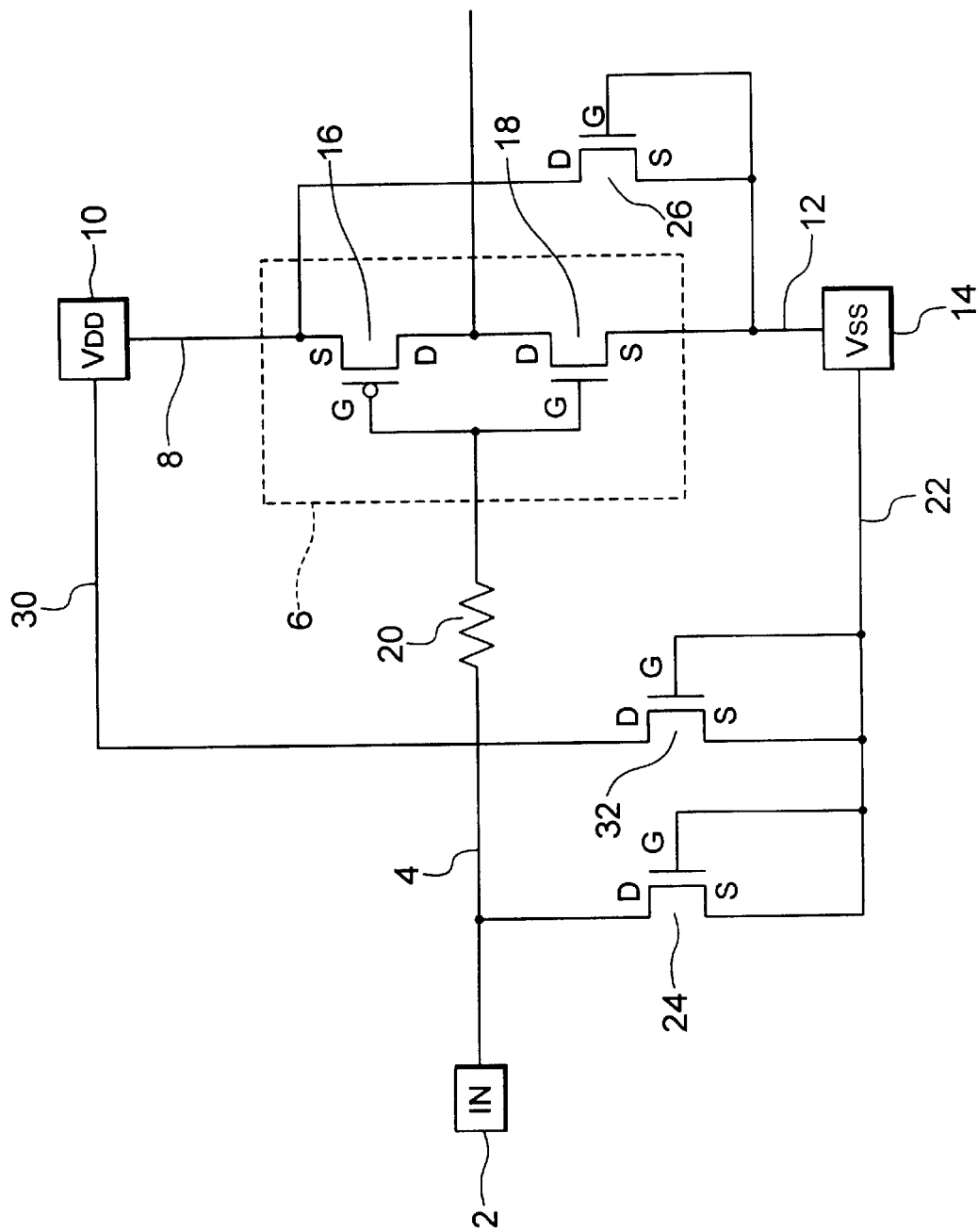
FIG. 3 is a circuit diagram illustrating a third embodiment.

Referring to FIG. 3, the third embodiment adds another internal power-supply line 30 and a third grounded-gate NMOS protection transistor 32 to the configuration of the first embodiment. This additional power-supply line 30 is coupled to the power-supply terminal 10. NMOS protection transistor 32 has its drain electrode coupled to this power-supply line 30, and its source and gate electrodes coupled to ground line 22.

Figure 4:
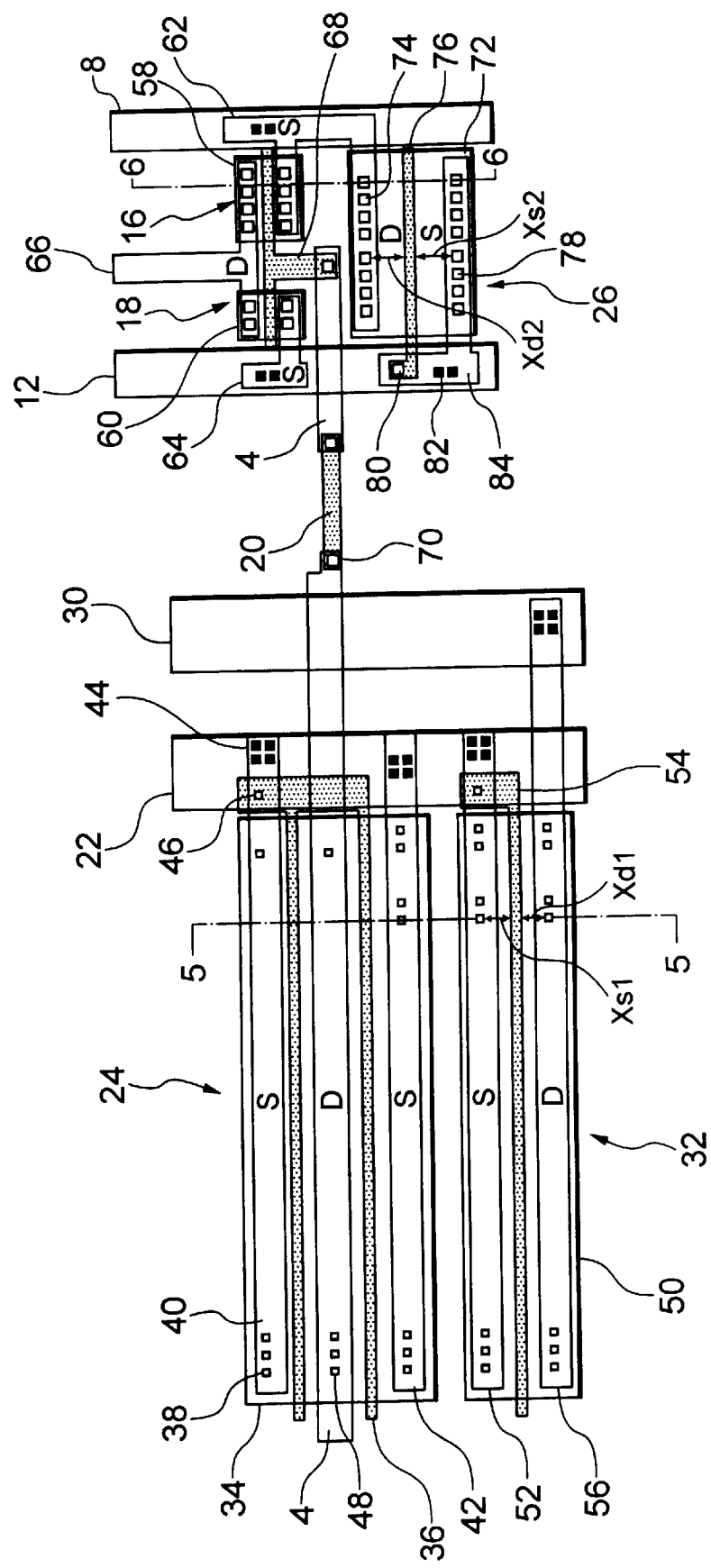
FIG. 4 is a circuit layout diagram illustrating the third embodiment.

FIG. 4 shows the layout of the elements in FIG. 3, omitting the input, power-supply, and ground terminals. The input signal line 4 and the metal electrode lines described below are disposed in a first layer of metal interconnecting lines. The internal power-supply lines 8, 30 and internal ground lines 12, 22 are disposed in a second layer of metal interconnecting lines, above the first level. Metal-to-metal contact holes are denoted by small black squares, and metal-to-semiconductor contact holes by small white squares.

The first NMOS protection transistor 24 is formed in an n-type diffusion region or active region 34 having p-type body areas (not visible) underlying a polysilicon gate 36. The p-type body areas divide the active region 34 into a central n-type drain area (D), and two outer n-type source areas (S). The source areas are electrically coupled through contact holes 38 to a pair of metal source electrode lines 40, 42, which are coupled through further contact holes 44 to ground line 22. The polysilicon gate 36 is coupled through a contact hole 46 to source electrode line 40. The drain area is coupled through contact holes 48 to the input signal line 4.

The third NMOS protection transistor 32 is formed in another active region 50, and has a generally similar structure but with only a single source electrode line 52. The metal source electrode line 52 is coupled through contact holes to the source area of the active region 50, to a polysilicon gate electrode 54, and to ground line 22. The drain electrode line 56 is coupled through contact holes to the drain area of the active region 50, and to power-supply line 30.

PMOS transistor 16 is formed in an active region 58, and NMOS transistor 18 in an active region 60. Metal source electrode lines 62, 64 couple the source area of active region 58 to internal power-supply line 8, and the source area of active region 60 to internal ground line 12. PMOS transistor 16 and NMOS transistor 18 share a common metal drain electrode line 66, and a common polysilicon gate 68.

The resistor 20 is a polysilicon resistive element, coupled by a contact hole 70 to the input signal line 4. A further continuation of the input signal line 4 couples the resistor 20 to the polysilicon gate 68 of PMOS transistor 16 and NMOS transistor 18.

The second NMOS protection transistor 26 is formed in an active region 72, the drain area of which is coupled by contact holes 74 to the metal electrode line 62 that forms the source electrode of PMOS transistor 16. The source area and polysilicon gate 76 of NMOS protection transistor 26 are coupled through contact holes 78, 80 to a source electrode line 82, which is coupled through further contact holes 84 to ground line 12.

A feature of the third embodiment is that the distance Xs1 from the source contact holes to the polysilicon gate 54 in the third NMOS protection transistor 32 is less than the corresponding distance Xs2 from the source contact holes 78 to the polysilicon gate 76 in the second NMOS protection transistor 26, and the distance Xd1 from the drain contact holes to the polysilicon gate 54 in protection transistor 32 is less than the corresponding distance Xd2 from the drain contact holes 74 to the polysilicon gate 76 in protection. transistor 26. The third NMOS protection transistor 32 also has a wider gate and channel than the second NMOS protection transistor 26.

Figure 5:
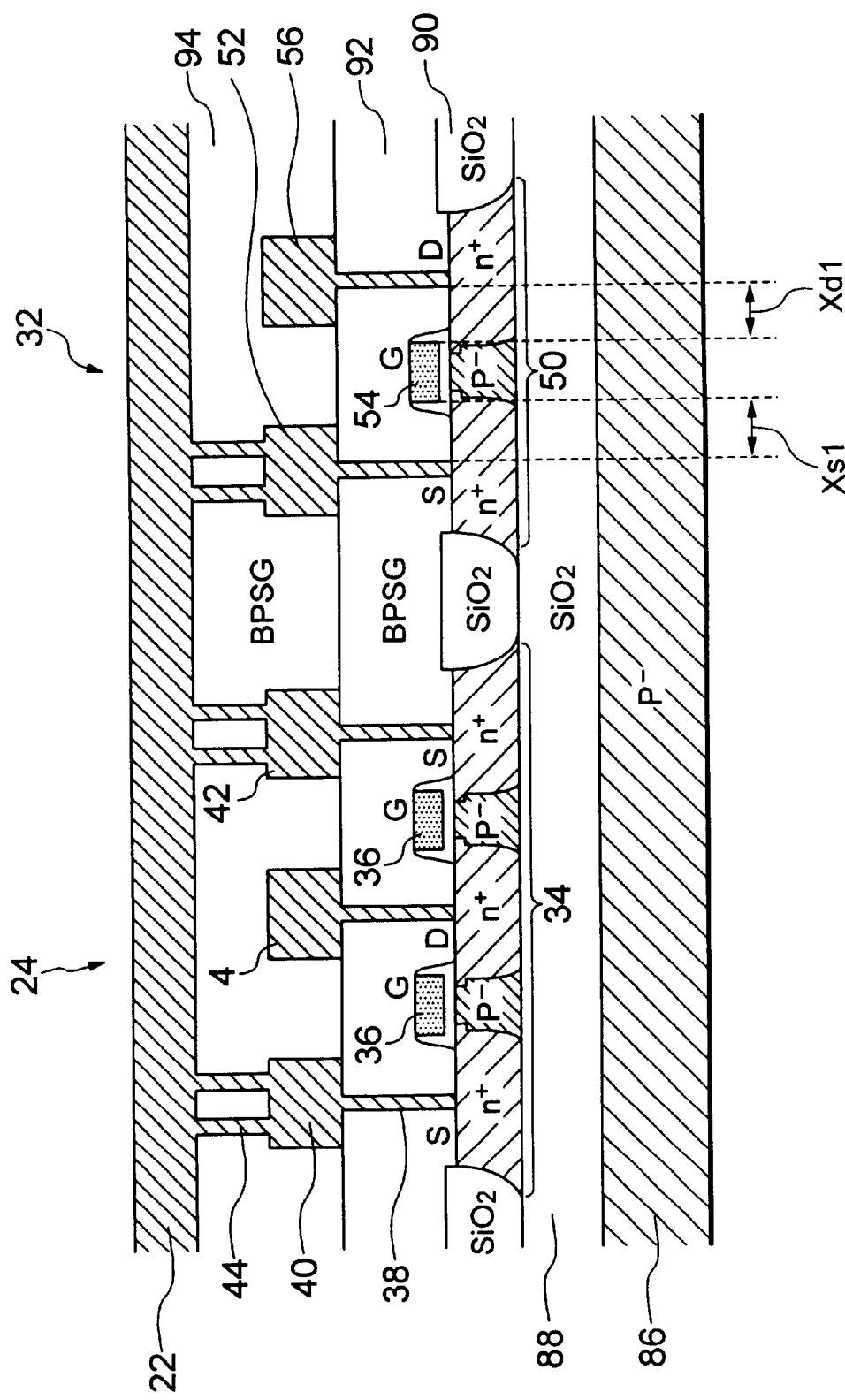
FIG. 5 is a sectional view through line 5—5 in FIG. 4.

FIG. 5 shows a sectional view through line 5—5 in FIG. 4. The integrated circuit as a whole is fabricated on a p-type silicon semiconductor substrate 86 with a buried oxide layer 88 formed by implantation of oxygen ions. In the active region 34 of NMOS protection transistor 24, p-type body areas are indicated by the symbol p⁻, and n-type source and drain areas by the symbol n⁺. Similar symbols are used in the source, drain, and body areas in the active region 50 of NMOS protection transistor 32. These active regions 34, 50 are isolated from one another, and from the active regions of other transistors (not visible), by field oxide areas 90 formed by local oxidation of silicon (LOCOS). Each transistor is therefore surrounded from below and on all four sides by silicon-dioxide ($SiO_2$) insulating material. The surfaces of the transistors are isolated from the first layer of metal interconnecting lines 4, 40, 42, 52, 56 by a layer of another insulating material such as borophosphosilicate glass (BPSG).

For explanatory purposes, FIG. 5 shows ground line 22 and the contact holes 44 by which source electrode lines 40, 42, 52 are connected to ground line 22, although this ground line 22 and these contact holes are not disposed in the same cross-sectional plane as the other parts of FIG. 5. The two metal layers are separated by another insulating layer 94 of, for example, BPSG.

Figure 6:
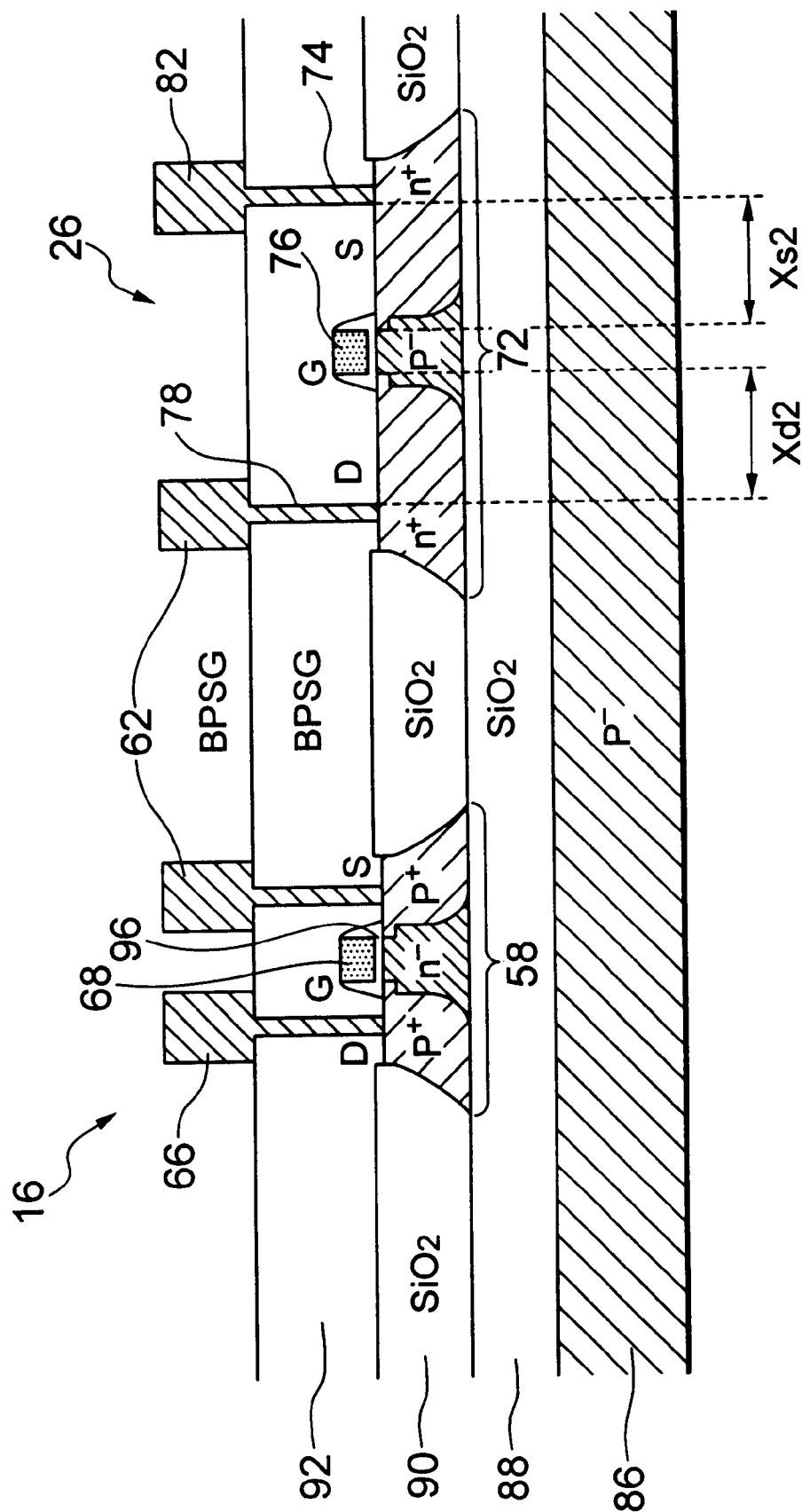
FIG. 6 is a sectional view through line 6—6 in FIG. 4.

FIG. 6 shows a sectional view through line 6—6 in FIG. 4, illustrating the structure of PMOS transistor 16 and NMOS protection transistor 26, and showing the gate oxide 96 of PMOS transistor 16. The source and drain areas in the active region 58 of PMOS transistor 16 are p-type areas, as indicated by the symbol p⁺, while the body area is an n-type area, as indicated by the symbol n⁻.

Next, the operation of the third embodiment will be described.

When a positive or negative surge is applied to the signal input terminal 2, the second NMOS protection transistor 26 protects the gate oxide 96 of PMOS transistor 16 as explained in the first embodiment. The third NMOS protection transistor 32 further enhances this protection by conducting the surge to power-supply line 30, thus to power-supply terminal 10, power-supply line 8, and the source electrode of PMOS transistor 16. The source electrode line 62 of PMOS transistor 16 therefore receives the surge potential from both power-supply line 8 and the second NMOS protection transistor 26, instead of only from protection resistor 26, and can reach a potential closer to the surge potential than was possible in the first embodiment.

If a large positive surge is applied to the power-supply terminal 10, the second and third NMOS protection transistors 26, 32 both undergo source-drain breakdown and conduct surge current to the ground terminal 14. Most of this current flows through the third NMOS protection transistor 32, partly because of its greater channel width, and partly because of the relations Xs1<Xs2 and Xd1<Xd2 illustrated in FIGS. 4, 5, and 6, which increase the amount of electrical resistance offered by the n⁺ source and drain areas of the second NMOS protection transistor 26. In other words, less current flows through protection transistor 26 than through protection transistor 32 because the current has to follow a longer and narrower path through semiconductor material in protection transistor 26 than in protection transistor 32.

Similar effects are produced during a negative surge at the power-supply terminal 10, and during positive and negative surges at the ground terminal 14. Both the second and third NMOS protection transistors 26 conduct surge current between the power-supply and ground terminals, but most of the current takes the easier path through the third NMOS protection transistor 32.

Since the second NMOS protection transistor 26 does not have to conduct large flows of current between the power-supply terminal 10 and ground terminal 14, this protection transistor 26 can have adequate current-carrying capability and still be small enough to fit into the space between the power-supply line 8 and ground line 12, adjacent the CMOS inverter 6, as shown in FIG. 4. The second NMOS protection transistor 26 can accordingly be laid out with minimal effect on the design of the CMOS inverter 6 and adjacent logic circuits.

In CMOS IC designs in general, there tends to be more space available near input and output signal lines than in internal logic circuitry. The comparatively large size of NMOS transistors 24, 32 in FIG. 4 is thus not a serious disadvantage, while the comparatively small size of NMOS protection transistor 26 is a definite advantage.

Although the relations Xs1<Xs2 and Xd1<Xd2 are desirable, they are not strictly necessary. The second and third NMOS protection transistors 26, 32 may have equal gate-to-contact-hole dimensions (Xs1=Xs2 and Xd1=Xd2). The gate-to-contact-hole dimensions (Xs2, Xd2) of NMOS protection transistor 26 are preferably not less than the gate-to-contact-hole dimensions (Xd1, Xd2) of NMOS protection transistor 32, however, as that would partially reverse the effect of the greater channel width of NMOS protection transistor 32.

Next, the fourth embodiment will be described.

Figure 7:
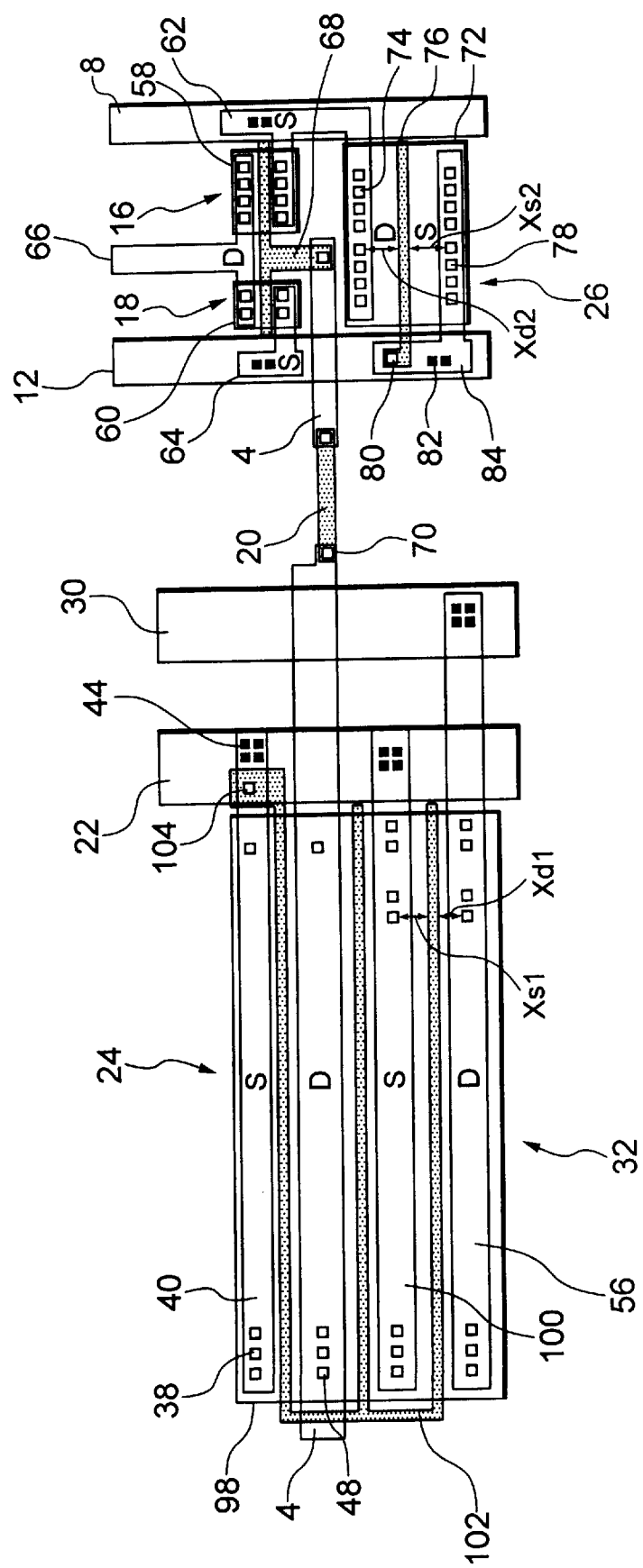
FIG. 7 is a circuit layout diagram illustrating a fourth embodiment.

Referring to FIG. 7, the fourth embodiment is identical to the third embodiment, except that the first and third NMOS protection transistors 24, 32 are formed in the same active region 98, and share a common source area. They accordingly share a common source electrode line 100, which combines the functions of two source electrode lines 42, 52 in the third embodiment. The polysilicon gates of these two NMOS protection transistors 24, 32 are joined together, and the combined polysilicon gate 102 is coupled through a contact hole 104 to source electrode line 40. The distances Xs1 and Xd1 from the source and drain contact holes in the third NMOS protection transistor 32 to the polysilicon gate 102 are the same as in the third embodiment, and the relations of these distances to the corresponding distances in the second NMOS protection transistor 26 are also the same (Xs1<Xs2 and Xd1<Xd2).

The fourth embodiment operates in the same way as the third embodiment, but the input protection circuit takes up less space, because the first NMOS protection transistor 24 and third NMOS protection transistor 32 are formed in the same active region 98. Compared with the third embodiment, one source area and one source electrode line are eliminated, and the field oxide region separating the active region of transistor 24 from the active region of transistor 32 is eliminated.

As is apparent from FIGS. 4 to 7, the invented input protection circuit can be fabricated without introducing extra process steps or altering conventional circuit design rules.

Although described above in relation to an input circuit, the invention is also useful in protecting an input-output circuit of the open-drain type. In FIG. 1, for example, an NMOS output transistor with a gate driven by output logic circuitry can be coupled in parallel with the first NMOS protection transistor 24, making the external terminal 2 an input-output terminal. The function of conducting input surges to the internal ground lines is then shared by the protection transistor 24 and output transistor, so the channel width of the protection transistor 24 can be reduced.

The invention can also be used to protect input signal lines that must be able to accept input voltages below ground level, by replacing the protection transistors 24, 26 shown in FIG. 3, for example, with a first protection transistor coupled between the input signal line 4 and power-supply line 30, and a second protection transistor coupled between power-supply line 8 and the source electrode of NMOS transistor 18.

Although the protection transistors have been described as NMOS transistors, it is possible to use PMOS transistors having gate electrodes coupled to the power supply.

Those skilled in the art will recognize that further variations are possible within the scope claimed below.

What is claimed is:

1. An input protection circuit in a silicon-on-insulator CMOS integrated circuit in which an input terminal is electrically coupled by an input signal line through a resistive element to gate electrodes of a CMOS inverter, the CMOS inverter also receiving a first power-supply potential from a first internal power-supply line and a second power-supply potential from a second internal power-supply line, comprising:

a third internal power-supply line electrically coupled to said first power-supply line;

a first protective element coupled between said input signal line and said third internal power-supply line; and a second protective element coupled between said first internal power-supply line and said second internal power-supply line, wherein said CMOS inverter includes a transistor having a source electrode coupled to said second internal power-supply line, and said second protective element is coupled directly to said source electrode.

2. An input protection circuit in a silicon-on-insulator CMOS integrated circuit in which an input terminal is electrically coupled by an input signal line through a resistive element to gate electrodes of a CMOS inverter, the CMOS inverter also receiving a first power-supply potential from a first internal power-supply line and a second power-supply potential from a second internal power-supply line, comprising:

a third internal power-supply line electrically coupled to said first power-supply line;

a first protective element coupled between said input signal line and said third internal power-supply line;

a second protective element coupled between said first internal power-supply line and said second internal power-supply line;

a fourth internal power supply line electrically connected to said second power-supply line; and a third protective element coupled between said third internal power-supply line and said fourth power supply line, wherein said second protective element and said third protective element are field-effect transistors of identical channel type, both having a gate electrode receiving one of said first power-supply potential and said second power-supply potential, thereby normally being switched off, both also having source and drain contact holes, the gate electrode of said second protective element being at least as distant from the source and drain contact holes of said second protective element as the gate electrode of said third protective element is distant from the source and drain contact holes of said third protective element.

3. The input protection circuit of claim 2, wherein said first protective element is also a field-effect transistor of said identical channel type, having a gate electrode receiving one of said first power-supply potential and said second power-supply potential, thereby normally being switched off, said first protective element and said third protective element being formed in a single active region and sharing a common source area.

* * * * *